United States Patent [19]

Koskenmaki

[11] Patent Number: 4,904,526
[45] Date of Patent: Feb. 27, 1990

[54] ELECTRICALLY CONDUCTIVE METAL OXIDE COATINGS

[75] Inventor: David C. Koskenmaki, St. Paul, Minn.

[73] Assignee: 3M Company, St. Paul, Minn.

[21] Appl. No.: 237,855

[22] Filed: Aug. 29, 1988

[51] Int. Cl.⁴ .................... B32B 15/16; B32B 31/26; B32B 15/08; B32B 31/22
[52] U.S. Cl. .................... 428/328; 427/333; 427/343; 427/412.1; 427/419.5; 428/402; 428/702; 428/469
[58] Field of Search ............. 427/333, 343, 412.1, 427/419.5; 428/328, 402, 469, 702

[56] References Cited

U.S. PATENT DOCUMENTS

| | | |
|---|---|---|
| 2,932,590 | 4/1960 | Barvett et al. |
| 3,227,132 | 1/1966 | Clough et al. |
| 3,847,659 | 11/1974 | Sobajima et al. ............ 117/211 |
| 4,094,675 | 6/1978 | Beschoner et al. |
| 4,097,266 | 6/1978 | Takahashi et al. |
| 4,336,277 | 6/1982 | Bunshah et al. |
| 4,367,745 | 1/1983 | Welage |
| 4,393,120 | 7/1983 | Watai et al. |
| 4,394,210 | 7/1983 | Morimoto et al. ........... 156/608 |
| 4,500,567 | 2/1985 | Kato et al. |
| 4,600,654 | 7/1986 | Lindner |

FOREIGN PATENT DOCUMENTS 3235963 3/1984 Fed. Rep. of Germany .

OTHER PUBLICATIONS

A. L. Dawar, J. C. Joshi, "Seminconducting Transparent Thin Films: Their Properties and Applications," Journal of Materials Science 19 (1984), pp. 1-23.
G. Haacke, "Transparent Conducting Coatings," Annual Review of Materials Science (1977), pp. 73-91.
A. M. Jarzebski, "Preparation and Physical Properties of Transparent Conducting Oxide Films," Physical Status Solidi (1982), pp. 13-41.

Primary Examiner—George F. Lesmes
Assistant Examiner—Christopher Brown
Attorney, Agent, or Firm—Merchant, Gould, Smith, Edell, Welter & Schmidt

[57] ABSTRACT

A method for forming a metal oxide film on a substrate is provided comprising the steps of depositing a continuous metal layer having an exposed surface onto a substrate, forming a metal oxide layer on the exposed surface, contacting the oxide layer with an effective amount of a fluxing agent, providing a protective polymeric layer on the oxide layer and forming discrete metal microspheres by melting the metal layer. A metal polymer composite comprising a continuous metal oxide layer which may be transparent is thus provided.

25 Claims, 1 Drawing Sheet

ELECTRICALLY CONDUCTIVE METAL OXIDE COATINGS

TECHNICAL FIELD

The present invention relates to a method for forming a metal oxide coating on a substrate and, particularly, to metal oxide composites which are optically transparent and electrically conductive.

BACKGROUND

Metal oxide films, such as indium oxide and indium-tin oxide, are known to be optically transparent and electrically conductive. Transparent and electrically conductive films are used, for example, in solar thermal energy conversion, solar photovoltaic conversion, solar heating, static control films, laser resistant coatings in high power laser technology, as the photocathode in photoelectrochemical cells, and as surface layers in electroluminescent applications. See, A. L. Dawer, S. G. Joshi, Review of semiconducting transparent thin films; their properties and applications, *Journal of Materials Science,* 19 (1984) pp. –23.

While the utility of metal oxide films has been well known, processes for manufacturing metaloxide films have been slow and expensive. Indium oxide and indium-tin oxide are two well-known metal oxides which can be formed into thin layers having low electrical resistance and high optical transparency. Indium oxide and indium-tin oxide films can be made by, for example, magnetron sputtering or by evaporating indium or indium tin oxide onto a substrate in an atmosphere containing carefully controlled amounts of oxygen and argon. However, these processes are very slow and difficult to control and, therefore, are quite expensive.

Therefore, there is a need for a process by which coatings of metal oxides, such as indium oxide or indium tin oxide, can be produced quickly and economically. Further, there is a need for producing metal oxide coatings which are electrically conductive and allow sufficient amounts of visible light to pass through the coating. The present invention provides a fast and economical process for forming a metal oxide film which is supported between a substrate and a protective polymeric coating.

SUMMARY OF THE INVENTION

The present invention provides a simple, fast and economical method for forming a continuous metal-oxide film which is supported between a substrate and a polymeric coating. The method comprises the steps of depositing a continuous layer of metal onto a substrate, forming a metal oxide layer on the metal, contacting the oxide layer with an effective amount of a fluxing agent, providing a protective polymer layer on said oxide layer, and forming discrete metal microspheres by melting the metal layer.

The process preferably comprises the steps of: forming a suitable metal vapor in a vacuum chamber, preferably indium, tin, indium-tin, cadmium, cadmiumtin, or the metals or alloys with antimony or fluorine; and depositing the metal vapor onto a polymeric substrate in the form of a continuous metal layer having an exposed surface; forming an oxide layer on the exposed surface of the metal by heating the metal in the presence of oxygen; treating the metal oxide layer with an effective amount of a fluxing agent; applying a polymeric protective coating layer to the metal oxide layer; and heating the composite sufficiently to melt the metal layer, the melted metal forming a plurality of discrete metal microspheres which are embedded in the metal oxide layer.

An "effective amount" of a fluxing agent is defined to be the amount necessary to penetrate the metal oxide layer and sufficiently loosen or weaken the bond between the metal oxide and the metal itself so that metal microspheres will form when the metal layer is melted. The term "embedded", and variants thereof, as used herein are defined to include all conformations where the oxide layer and the metal microspheres are in contact with each other. As used herein, forming a metal oxide layer on the exposed surface of the metal, means oxidizing the surface of the metal to form a metal layer therein, as is known in the art. An oxide layer is not deposited onto the surface but instead part of the metal layer becomes the metal oxide layer.

This process produces a composite having metal microspheres and metal oxide layer supported between a substrate and a polymeric layers. The discrete metal microspheres are embedded in a continuous layer of the metal oxide. This layer is supported between the substrate and the protective polymeric coating.

DETAILED DESCRIPTION OF THE INVENTION

Figure 1:
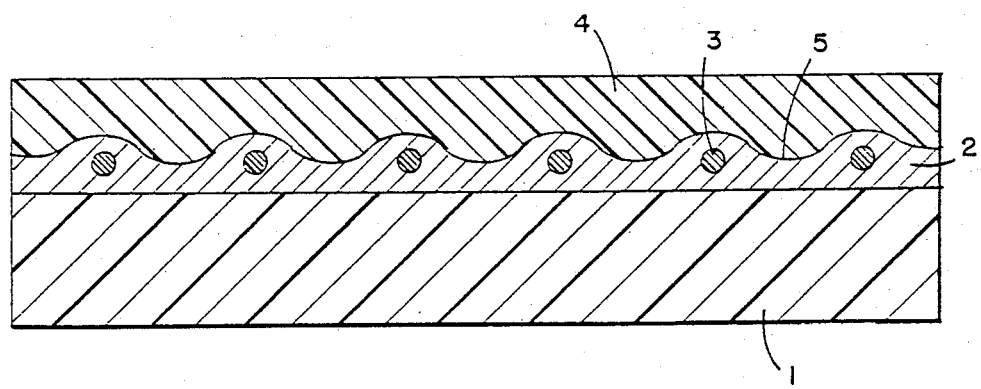
FIG. 1 is a schematic cross-section of a composite of the present invention showing the metal microspheres and the metal oxide layer being supported between a substrate and a polymeric layer. The drawing is not necessarily to scale.

The present invention provides a fast and economical method by which a metal oxide film can be produced which is supported between a substrate and a polymeric layer. The metal oxide film is continuous, preferably electrically conductive and optically transparent, and has discrete metal microspheres embedded therein.

Referring to FIG. 1, a cross-sectional schematic depiction of a composite of the present invention is shown. A substrate 1 supports a continuous coating of a metal oxide layer 2. The metal oxide layer 2 has a plurality of discrete metal microspheres 3 embedded therein. A protective polymeric coating 4 is coated onto a top surface 5 of the metal oxide layer 2.

Components

A wide variety of materials may be used as substrates in the present invention. It has been found that many polymeric and non-polymeric materials are suitable as substrates. The substrate should be able to have a layer of the liquid metal, deposited thereon. The substrate is also preferably transparent and has other characteristics as dictated by the particular anticipated end use of the composite.

Polymers which may be selected for use in the present invention include: engineering plastics such as polystyrene, styrene/acrylonitrile copolymers, copolymers containing polymerized styrene, acrylonitrile and butadiene (often called ABS polymers), styrene/butadiene copolymers, rubber modified styrene polymers, styrene/maleic anhydride copolymers and similar polymers of monovinylidene aromatic carbocyclic monomers, polycarbonates including those made from phosgene and bisphenol A and/or phenolphthalein, polyesters such as polyethylene tetrephthalate, acrylic resins such as poly(methyl methacrylate), polyacetyl resins such as polyformaldehyde resin, nitrile resins such as polyacrylonitrile and other polymers of a B-ethylenically unsaturated nitriles such as acrylonitrile/methyl methacrylate copolymers, polyimides, polyamides such as nylon, polyolefins such as polyethylene and polypropylene, polyvinyl halides such as polyvinyl-chloride, vinylidene chloride homopolymers and copolymers, polyurethanes; polyallomers; polyphenylene oxides; polylmers of fluorinated olefins such as polytetrafluoroethylene, silicone polymers; and cellulosic polymers.

The thickness of the substrate is not particularly important to the practice of the present invention and should be determined by the characteristics and properties which are dictated by the end use for which the composite is designed. Such end use characteristics or properties include: transparency, flexibility, tensile strength, corrosion resistance, and the like.

The metal which comprises the metal layer and is used to form the metal oxide layer of the composite of the present invention, is preferably one which in the oxide form is transparent to visible light and has a low electrical resistivity. The metal should also preferably have a melting point which is less than the degradation point of the substrate or protective polymer chosen for use in the composite of the present invention.

Preferred metals include indium, Indium, indium-tin, tin, cadmium, cadmium-tin, mixtures thereof, and metals or alloys which are antimony or fluorine doped. Indium and indium-tin alloys which have a tin composition of between 5 and 25 percent by weight are particularly preferred for use in the present invention.

It is to be understood that because of the nature of the process of the present invention that when the terms "metal" and "metal oxide" are used they refer to a metal or metal alloy and the oxide made from oxidizing that particular metal or metal alloy. The term "metal" will refer to substantially pure metals, alloys, and mixtures.

The fluxing agent of the present invention is a composition which will penetrate the metal oxide layer and sufficiently loosen or weaken the bond between the metal oxide layer and the metal layer so that when the metal layer is melted, it will form discrete metal microspheres leaving the continuous metal oxide layer intact. Examples of suitable fluxing agents include acetic acid, zinc chloride, phosphoric acid, dilute hydrochloric acid and other known fluxing agents for the particular metal and metal oxide used in the present invention.

The fluxing agent is used in a sufficient concentration to sufficiently loosen the bond between the metal oxide layer and the metal layer to allow microsphere formation upon melting of the metal layer, but should be weak enough so that it does not dissolve, corrode or otherwise degrade the metal oxide layer, the substrate, or the protective polymeric layer. Preferably, the fluxing agent is volatile enough so that it will evaporate after it has performed its fluxing operation. If the fluxing agent evaporates from the system, it will not present a risk of subsequent degradation to components of the composite.

Protective polymers which are suitable for use in the present invention may be selected from the broad range of polymers which are suitable for use as the substrate discussed above. If it is desired that the fluxing agent be dissolved in the liquid protective polymer and simultaneously coated onto the metal oxide layer, the particular fluxing agent and protective polymer chosen should be compatible. The fluxing agent should be soluble in the liquid polymer during and after curing of the protective polymeric layer.

Process Parameters

The process of the present invention involves first depositing a metal layer onto a substrate. A preferred method of deposition is through vacuum deposition. A metal vapor is formed in a vacuum chamber and a continuous layer of this metal is deposited onto a polymeric substrate. In a typical vapor deposition process, the minimum thickness to form a continuous metal layer is at least about 500 angstroms. More than one layer of a metal can be deposited or layers of different metals may be deposited.

A preferred method of forming the metal vapor in the vacuum is through one of several means of evaporation. A metal vapor formed by sputtering would also be suitable, albeit typically slower in depositing.

A preferred form of evaporation is evaporation by means of heating the metal with an electron beam. Typically, the metal is placed in a small water-cooled metal crucible and an electron beam is produced and focused on the metal in the crucible by means of a magnetic field. Typically a current of about 0.1 to 1 amp is accelerated to 10,000 volts and the metal is vaporized. An electron beam power supply commercially available from Airco Temescal is an example of a suitable apparatus. Other methods of evaporating the metal or metals include resistive heating and induction.

After the metal vapor is created, it rises through the vacuum chamber until it is deposited onto the substrate positioned above. It is preferred that the substrate be a moving web which is passed through the metal vapor in the vacuum chamber at a speed sufficient to deposit a layer of the metal having a desired thickness. A layer of at least about 500 angstroms thick must typically be formed on the polymeric substrate because thinner layers tend to form islands of the metal and not the desired continuous metal layer.

The use of electron beam evaporation, or other evaporation methods, can be used to deposit metal onto a substrate in a wide range of deposition rates and in a wide range of thicknesses. It is preferred that the thickness of the deposited metal layer be between about 500 and about 1,000 angstroms.

After a metal layer is deposited on the polymeric substrate, the exposed surface of the metal layer is oxidized. The exposed surface of the metal means the side of the metal which is not in contact with the substrate. Oxidation of the exposed surface of the metal can be accomplished by simply leaving the coated substrate in the presence of oxygen for a sufficiently long time to provide an oxide layer of a sufficient thickness. It is, however, preferred that the metal layer coated on the polymeric substrate be heated in the presence of oxygen to speed the formation of the oxide layer. The metal should not be heated to a temperature which causes premature melting of the metal layer. In the case of indium or indium tin this temperature is preferably between about 90° C. and about 150° C. for one or more hours.

An oxide layer is formed having a sufficient thickness, such that the electrical resistance is sufficiently low and the strength of the layer is sufficient so that a continuous oxide layer remains in the final composite. In the case of indium or indium tin, an oxide layer of between about 50 and about 100 angstroms has been found to have a sufficiently low resistance, sufficient strength, is optically transparent and is formed quickly.

Indium oxide and indium-tin oxide films (as do other oxides) act as a diffusion barrier to oxygen and at a certain thicknesses act to prevent further oxidation altogether. The oxide thickness can be increased past this thickness by annealing the layer in a pure oxygen atmosphere, treating the film with an oxygen plasma or by using a strong oxidizing agent, such as ozone.

After the metal layer is deposited onto the polymeric substrate, if desired, it can be formed into a roll to affect the oxidation of the metal. Also, rewrapping the metal/polymer web with a porous paper inner layer has been found to increase the speed of the oxidation layer of the resultant oxide layer.

After the metal oxide layer has been formed, the next step is to loosen the bond between the metal oxide and the metal by using an effective concentration and amount of a fluxing agent. If a fluxing agent is not applied or is not applied in a sufficient concentration or amount, microsphere formation will be hindered. The fluxing agent permeates the oxide layer and weakens the bond between the oxide and the metal. The bond between the oxide and the metal must be sufficiently weakened so that the metal is free to form microspheres in the later step.

After the oxide layer has been treated with a fluxing agent, a protective polymeric layer is applied to the metal oxide. The protective polymeric coating supports the oxide layer and keeps it from disintegrating or becoming discontinuous when the metal layer is melted to form microspheres. It is preferred that the protective polymeric coating be transparent so that visible light can pass through.

The fluxing agent may be dissolved in the liquid polymeric protective coating and the mixture coated onto the metal oxide layer. If this is done, it is preferred that the polymer and the fluxing agent be compatible.

After the protective polymeric layer has been applied and is dried or cured to a sufficient consistency to adequately protect the metal oxide layer, the metal layer is then melted to form discrete metal microspheres. The discrete metal microspheres are embedded in the metal oxide layer. Both the metal oxide layer and metal microspheres are supported between the substrate and the protective polymeric layers. If the metal oxide layer, the substrate, and the polymeric layer are transparent, the composite will be transparent as the microspheres block very little transmitted light.

The metal microspheres are formed when the metal layer is made sufficiently liquid to form microspheres. Microspheres are typically formed by heating the metal layer. One method of heating the metal layer is passing the polymeric composite quickly over a hot roll having a temperature sufficient to melt the metal layer without degrading the metal oxide, substrate or polymeric layer. After the metal layer has been melted, the metal forms discrete metal microspheres which are usually too small to be visible to the unaided eye, typically 0.5 to 3.0 micrometers. For example, a 1000 Angstroms thick metal layer will typically form metal microspheres having an average diameter of about 2 micrometers. These metal microspheres are sufficiently spaced apart so that very little of the transmitted visible light is blocked when passing through the metal oxide and metal microsphere layer. Typical electrical resistivities of the metal oxide layer is in the range of between about 1,000 and 5,000 ohms per square.

The present invention is further described by way of the following non-limiting examples:

EXAMPLE 1

Composites of the present invention were made by first loading one hundred feet of 25 cm wide and 0.025 millimeters thick polyester manufactured by 3M Company into a vacuum web coater. The coater included a 40 cm diameter chill roll and take-up and feed rolls. The coater had an electron beam evaporation source 25 cm below the chill roll. The evaporation source and corresponding power supply were manufactured by Airco Temescal. The evaporation pot was lined with 0.16 cm thick zirconia felt to provide thermal insulation and more efficient evaporation. A 300 gram sample of indium was placed in the pot. The vacuum chamber was pumped down to a pressure of $2 \times 10^{-5}$ Torr. The web was traversed in contact with the chill roll at 16 cm/sec and the indium was evaporated by directing a 10 KeV 0.16 amp electron beam into the pot. Under these conditions, a 1000 Angstroms thick film of indium was formed on the polyester. The indium thickness was determined by measuring the absorption in the indium layer of x-rays diffracted from the polyester substrate.

Ten 3.75 cm by 22.5 cm samples were cut from the web and placed in an oven set at 110° C. The samples were removed one at a time after elapsed times varying from 15 minutes to 19 hours. A 3.75 cm by 3.75 cm area on each sample was coated with a mixture of 10 g polyvinyl pyrrolidinone (PVP) (K60, 60,000 molecular weight) dissolved in 50 ml water, 10 ml of glacial acetic acid, and one drop of a surfactant (Turgitol TMN). The coatings were dried in air. The polyester side of each of the samples was then placed in contact with a 175° C. hot plate surface for about 1 second, which caused the indium metal film to form very fine beads under the PVP-acetic acid coated area of each sample, and which caused these areas to become transparent. The following values for electrical resistance were obtained for the samples:

| Time in 110° C. oven (hours) | resistance (ohms/square) |
| --- | --- |
| 0 | >50 Megohms |
| 0.25 | 30 Megohms |
| 0.5 | 1.7 Megohms |
| 1.0 | 15.8 kilohms |
| 1.5 | 8 kilohms |
| 2.0 | 6 kilohms |
| 2.5 | 4 kilohms |
| 3.0 | 4 kilohms |
| 16 | 3 kilohms |
| 19 | 3 kilohms |

EXAMPLE 2

Composites of the present invention were made as described in Example 1 except that the pot was loaded with 250 g indium and 10 g tin and the web speed was set at 5 cm/sec. The other conditions were similar to those in Example 1. Since the vapor pressure of indium is much higher than that of tin (roughly 100 times at 1250° C.), the evaporated film alloy did not contain more than 10 wt % tin until the pot was nearly depleted. A piece of polyester 3.6 meters long which was coated toward the end of the experiment, was found to have a thickness of 1000 Angstroms and a composition of approximately 90 wt % indium, 10 wt % tin at its midpoint. The polyester was tightly wound up into a roll and placed into an oven at 80° C. for 52 hours. The sample was coated at its midpoint with the PVP-acetic acid mixture of Example 1 and dried. After the sample was heated to 175° C. to melt the excess indium-tin, it was found to have a resistance of 3500 ohms/square in the PVP-acetic acid treated area.

EXAMPLE 3

Composites of the present invention were made as described in Example 1 except that the pot was loaded with 155 g tin and 52 g indium. The electron beam was set to 10 Kev and 0.12 amp, and the web speed was 5 cm/sec. The resulting alloy film was analyzed at meter intervals by x-ray diffraction and x-ray fluorescence and found to have the following compositions:

| meters downweb | composition (wt % Sn) |
| --- | --- |
| .3 | 5 |
| 3.05 | 9 |
| 6.1 | 19 |
| 9.15 | 32 |
| 12.2 | 45 |
| 15.25 | 71 |
| 18.3 | 86 |
| 21.35 | 94 |
| 24.4 | 98 |

A sample of the film taken from 1.5 meters downweb (with approximately 7 wt % tin) was oxidized for 1 hour at 110° C.. About 1 square inch of this film was coated with PVP plus acetic acid and heated as in example 1 to melt the excess metal. This area had a resistance of 3000 ohms/square. A 3 mm diameter circular sample for transmission electron microscopy was punched out of the web at an adjacent area near the edge of the web. This area had a thinner coating of indium-tin because it was partly masked by shields in the evaporation chamber. The polyester substrate was then removed from this sample by dissolving the polyester in 70° C. orthochlorophenol. The film was supported on a 400 mesh copper microscope grid and was rinsed using acetone. The film was examined in a JEOL 200 CX transmission electron microscope.

What is claimed is:

1. A method for forming a metal oxide film on a substrate comprising the steps of:
   (a) depositing a continuous metal layer onto a substrate, said layer of metal having an exposed surface;
   (b) forming a metal oxide layer on said exposed surface;
   (c) contacting said oxide layer with an effective amount of a fluxing agent;
   (d) providing a protective polymer layer on said oxide layer; and
   (e) forming discrete metal microspheres by melting said metal layer.
2. The method of claim 1 wherein said metal layer is deposited on said substrate by forming a vapor in a vacuum chamber and depositing by means of vacuum deposition.
3. The method of claim 1 wherein said metal layer comprises a metal selected from the group consisting of indium, indium-tin, tin, cadmium, cadmium-tin, mixtures thereof, and such metals, alloys and mixtures doped with antimony or flourine.
4. The method of claim 3 wherein said metal is selected from the group consisting of substantially pure indium and an indium-tin alloy having between about 5 and about 25% tin by weight.
5. The method of claim 2 wherein said vapor is formed by evaporating said metal.
6. The method of claim 5 wherein said metal is evaporated by means of electron-beam evaporation.
7. The method of claim 1 wherein said oxide layer is formed by heating said metal layer in the presence of oxygen.
8. The method of claim 1 wherein said oxide layer has a resistance of less than about 5000 ohms/square.
9. The method of claim 8 wherein said oxide layer has a thickness of between about 50 and about 100 angstroms.
10. The method of claim 1 wherein said fluxing agent is a weak acid.
11. The method of claim 10 wherein said acid is sufficiently volatile so that it substantially evaporates from said composite within 1 hour after processing.
12. The method process of claim 1 wherein said metal layer is melted by heating said substrate, metal layer, metal oxide layer and protective polymer to a temperature of between about 115° C. and about 200° C. for between about 0.1 and about 5 seconds.
13. The method of claim 1 wherein said metal oxide film is optically transparent and electrically conductive.
14. A method for forming a metal/polymer composite comprising the steps:
   (a) providing a chamber having a substantial vacuum therein;
   (b) forming a metal vapor in said chamber by evaporation of a metal selected from the group consisting of indium, indium-tin, tin, cadmium, cadmium-tin, mixtures thereof, and such metals, alloys and mixtures which have been doped with antimony or flourine;
   (c) depositing said vapor on said substrate to form a metal layer at least about 500 angstroms thick on a polymeric substrate, said metal layer having an exposed substrate;
   (d) heating said polymeric substrate and said metal layer in the presence of oxygen to a temperature of between about 90° C. and about 150° C. for a time sufficient to form a metal oxide layer of between about 50 and about 100 Angstroms thick on said exposed surface;
   (e) contacting said metal oxide layer with an effective amount of week acid;
   (f) coating said oxide layer with a protective polymer layer;
   (g) heating said composite to a temperature sufficient to melt said metal layer and form discrete metal microspheres;
15. The method of claim 14 wherein said metal is evaporated by means of electron-beam evaporation.
16. The method of claim 14 wherein said effective amount of acid is dissolved in said protective polymer and the mixture coated onto said metal oxide layer.
17. A metal/polymer composite comprising:
   (a) a substrate;
   supported by said
   (b) a metal oxide layer substrate, said metal oxide layer comprising discrete microspheres of said metal embedded in a continuous layer of said metal oxide; and (c) a protective polymer overlying said metal oxide layer.

18. The composite of claim 17 wherein said metal is selected from the group consisting of indium, indium-tin, tin, cadmium, cadmium-tin, and such metals doped with antimony or fluorine.

19. The composite of claim 18 wherein said substrate comprises a polymer.

20. The composite of claim 19 wherein said metal is selected from the group consisting of substantially pure indium and an indium-tin alloy having between about 5% and about 25% tin by weight.

21. The composite of claim 19 wherein said continuous oxide layer is between about 50 and about 100 angstroms thick.

22. The composite of claim 20 wherein said discrete metal microspheres have an average diameter of between about 0.5 and about 3.0 micrometers.

23. The composite of claim 18 wherein said composite is optically transparent and electrically conductive.

24. An opaque metal polymer composite made by the method of claim 14.

25. A substantially transparent metal polymer composite made by the method of claim 14.

* * * * *

UNITED STATES PATENT AND TRADEMARK OFFICE
CERTIFICATE OF CORRECTION

PATENT NO. : 4,904,526
DATED : Feb. 27, 1990
INVENTOR(S) : David C. Koskenmaki

It is certified that error appears in the above-identified patent and that said Letters Patent is hereby corrected as shown below:

Col. 1, line 23
 "pp. -23" should be --pp. 1-23--

Col. 1, line 25
 "metaloxide" should be -- metal-oxide--

Col. 1, line 60
 "cadmiumtin" should be --cadmium-tin--

Col. 5, line 4
 delete "a" (2nd)

Col. 7, line 68 & Col. 8, line 39
 "flourine" should be --fluorine--

UNITED STATES PATENT AND TRADEMARK OFFICE
CERTIFICATE OF CORRECTION

Page 2 of 2

PATENT NO. : 4,904,526
DATED : February 27, 1990
INVENTOR(S) : David C. Koskenmaki It is certified that error appears in the above-identified patent and that said Letters Patent is hereby corrected as shown below:

Col. 8, line 51
"week" should be --weak--

Col. 8, line 56
change the semi-colon to a period

Col. 8, line 64
delete "supported by said"

Col. 8, line 65
after "layer" insert --supported by said--

Signed and Sealed this

Thirteenth Day of August, 1991

Attest:

HARRY F. MANBECK, JR.

Attesting Officer

Commissioner of Patents and Trademarks